(12) United States Patent  (10) Patent No.: US 9,219,041 B2
Elad et al.  (45) Date of Patent: Dec. 22, 2015

(54) ELECTRONIC PACKAGE FOR MILLIMETER WAVE SEMICONDUCTOR DIES

(75) Inventors: Danny Elad, Moshav Liman (IL); Noam Kaminski, Kiryat Tivon (IL); Keishi Okamoto, Kanagawa (JP); Evgeny Shumaker, Nesher (IL); Kazushige Toriyama, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/433,317

(22) Filed: Mar. 29, 2012

(65) Prior Publication Data

US 2013/0256850 A1   Oct. 3, 2013

(51) Int. Cl.
*H01L 23/34*   (2006.01)
*H01L 23/52*   (2006.01)
(Continued)

(52) U.S. Cl.
CPC .......... *H01L 23/66* (2013.01); *H01L 2223/6616* (2013.01); *H01L 2223/6633* (2013.01); *H01L 2223/6683* (2013.01);
(Continued)

(58) Field of Classification Search
CPC ............ H01L 23/66; H01L 2924/3011; H01L 2924/30107; H01L 2223/6633; H01L 2223/6683
USPC ............ 257/664, 698, 713, 737, 738, E23.19; 333/247; 343/700 MS
See application file for complete search history.

(56) References Cited

U.S. PATENT DOCUMENTS 5,982,250 A * 11/1999 Hung et al. ............... 333/26
7,522,014 B2    4/2009 Koriyama
(Continued)

FOREIGN PATENT DOCUMENTS

JP    2006304113 A    11/2006
JP    2011029446 A    2/2011
(Continued)

OTHER PUBLICATIONS

Patent Cooperation Treaty, "Notification of Transmittal of the International Search Report and the Written Opinion of the International Searching Authority, or the Declaration (PCT Rule 44. 1)", International application No. PCT/IB2013/052434, International filed Mar. 27, 2013, pp. 1-9.

(Continued)

*Primary Examiner* — Fernando L Toledo
*Assistant Examiner* — Aaron Gray
(74) *Attorney, Agent, or Firm* — Noah A. Sharkan (57) ABSTRACT

A mmWave electronics package constructed from common Printed Circuit Board (PCB) technology and a metal cover. Assembly of the package uses standard pick and place technology and heat is dissipated directly to a pad on the package. Input/output of mmWave signal(s) is achieved through a rectangular waveguide. Mounting of the electronic package to an electrical printed circuit board (PCB) is performed using conventional reflow soldering processes and includes a waveguide I/O connected to an mmWave antenna. The electronic package provides for transmission of low frequency, dc and ground signals from the semiconductor chip inside the package to the PCB it is mounted on. An impedance matching scheme matches the chip to high frequency board transition by altering the ground plane within the chip. A ground plane on the high frequency board encircles the high frequency signal bump to confine the electromagnetic fields to the bump region reducing radiation loss.

15 Claims, 6 Drawing Sheets

(51) Int. Cl.
   *H01L 23/58*   (2006.01)
   *H01L 23/66*   (2006.01)

(52) U.S. Cl.
   CPC ............... *H01L 2224/48091* (2013.01); *H01L 2224/49171* (2013.01); *H01L 2224/49175* (2013.01); *H01L 2224/73265* (2013.01); *H01L 2924/3011* (2013.01); *H01L 2924/30107* (2013.01)

(56) References Cited

U.S. PATENT DOCUMENTS

| | | | |
|---|---|---|---|
| 7,768,457 B2 | 8/2010 | Pettus et al. | |
| 7,808,798 B2 | 10/2010 | Cotte et al. | |
| 8,912,634 B2 | 12/2014 | Danny et al. | |
| 2003/0231088 A1* | 12/2003 | Kikuchi et al. | 333/247 |
| 2007/0273008 A1* | 11/2007 | Suzuki | 257/659 |
| 2008/0029886 A1* | 2/2008 | Cotte et al. | 257/728 |
| 2008/0297283 A1* | 12/2008 | Byun et al. | 333/21 R |
| 2009/0206473 A1 | 8/2009 | Lopez et al. | |
| 2011/0051375 A1 | 3/2011 | Ammar | |
| 2011/0057741 A1 | 3/2011 | Dayan et al. | |
| 2011/0299256 A1 | 12/2011 | Leiba et al. | |

FOREIGN PATENT DOCUMENTS

| | | |
|---|---|---|
| WO | WO 2010127709 A1 * | 11/2010 |
| WO | 2013144862 A1 | 10/2013 |
| WO | WO 2013144862 A1 * | 10/2013 |

OTHER PUBLICATIONS

"Patent Act 1977: Examination Report under section 18(3)", Patents Directorate, Application No: GB1417884.2, Dec. 1, 2014, pp. 1-2.

* cited by examiner

ELECTRONIC PACKAGE FOR MILLIMETER WAVE SEMICONDUCTOR DIES

FIELD OF THE INVENTION

The present invention relates to the field of electronic packaging, and more particularly relates to an electronic packaging system suitable for millimeter wave semiconductor dies.

BACKGROUND OF THE INVENTION

Extremely high frequency or EHF is the highest radio frequency band and runs the range of frequencies from 30 to 300 GHz. The frequencies in this band have a wavelength of ten to one millimeter, giving it the name millimeter band or millimeter wave (mmWave). In high frequency mmWave circuits, the wavelengths involved are shorter compared to the wavelengths of lower frequencies, which are more commonly used. Thus, the loss per unit length is higher due to radiation, scattering and absorption. Millimeter wave signals, thus, are extremely sensitive to manufacturing inaccuracies. In order to overcome these difficulties, high quality expensive materials and technologies (e.g., ceramic substrates or organic buildup technology) is used that have low absorption and very low manufacturing inaccuracies. In addition, conventional mmWave packages use complex assembly processes.

Currently, many electronic package standards exist in the electronic industry. The vast majority of these packages are capable, however, of supporting only low frequency signals, while state of the art packages support up to 50 GHz signals relying on Surface Mount Technology (SMT) I/O to deliver the signal from the package to a printed transmission line on the electronic circuit board.

Commercial electronic packages for higher frequencies (above 50 GHz) usually rely on a rectangular waveguide interface either in a package for a single chip or in a multi-chip module with an integrated waveguide transition. These waveguide interfaces must be mounted using screws to other waveguide interfaces (such as to other modules or antenna) which increases the package's size and complicates the transmission of low frequency signals to the electronic circuit board.

Today, SMT packages are an industry standard with an established manufacturing procedure which enables low cost production. SMT packages allow ease of mounting on electronic circuit boards under an automated reflow soldering process without the need of mechanical connectors. Their small dimensions make it possible to make high density electronic circuit boards with many different components linked by a network of printed wires and transmission lines. Despite the advantages described above, SMT packages have two main drawbacks in the high frequency bands such as mmWave that cause high electrical losses.

A first drawback is that SMT packages include printed transmission lines such as microstrip or strip lines which exhibit high loss at high frequencies compared with waveguides, and thus a waveguide interface is preferred at those frequencies. A second drawback is that it is difficult to control the precise mounting location of the SMT package on the electric circuit board by means of reflow soldering. Thus, at least half the width of the component termination must be placed on the solder landing. This is a reasonable constraint when working with low frequency signals. When working with mmWave frequencies, however, small inaccuracies in printed transmission lines become significant and can cause high loss and radiation. Due to these two drawbacks, SMT packages are rarely used above 50 GHz.

Contrary to printed transmission lines such as microstrip and strip-lines, waveguides do not exhibit significantly higher loss at higher frequencies. Another benefit of waveguides is that the transmission between two waveguides is hardly affected by inaccuracies in their connection. Waveguide connections have three distinct drawbacks. The first drawback is that connecting a waveguide to a waveguide requires manual labor using screws with a large flange which also significantly enlarges the package size. The second drawback is the need to include more connectors in the package (besides the waveguide flange) in order to deliver low frequency signals, DC supplies, grounds, etc. from the package to the electrical circuit board. The third drawback is the high price of the package due to the expensive waveguide mechanism.

There is thus a need for mmWave packages that can be constructed from inexpensive, common materials and technology, that exhibit low loss and good heat dissipation and that can be manufactured using simple assembly processes.

SUMMARY OF THE INVENTION

A novel and useful electronic packaging system for mmWave semiconductor chips. The packaging system provides electrical connections between a millimeter wave semiconductor chip and an electric circuit board, while providing heat dissipation and a mechanical protective environment.

The invention comprises a mmWave electronics package constructed from common Printed Circuit Board (PCB) technology and a simple metal lid or cover. The semiconductor chip can be attached to the package using any well-known method, such as using bond wires or bumps (e.g., solder bumps). A hybrid embodiment may be constructed from both wire bonds and bumps. The assembly process uses a common pick and place technology and heat is dissipated directly to an exposed pad at the bottom of the package.

In one embodiment, the electronic package comprises a single layer of organic dielectric laminate that exhibits low loss at high frequencies, whereas the remainder of the package's materials may be constructed from various low cost materials. Input/output of mmWave signal(s) is achieved through a rectangular waveguide.

Mounting of the electronic package to an electrical printed circuit board (PCB) is performed using a conventional reflow soldering process without the need for cumbersome and expensive connection by screws, typically used in the prior art when a waveguide I/O is connected to an mmWave antenna or circuit.

In addition, the electronic package allows for simple transmission of low frequency, dc and ground signals from the semiconductor chip inside the package to the PCB it is mounted on using a Quad No-lead Flat (QNF) format.

Further, in one embodiment, ultra wideband transition from a mmWave semiconductor chip to the electronic package is based on bumps that allow for the use of conventional low cost manufacturing technology having poor accuracy.

Advantages of the electronic packaging system of the present invention include: (1) an integrated package that uses standard SMT connections allowing for the transmission of both low frequency signals and high frequency (HF) signals; (2) a small size electronic package compared with prior art waveguide based packages; (3) a low cost electronic package constructed from standard PCB materials and technology, allowing for the use of standard automated assembly processes using standard pick and place machines; (4) providing versatile semiconductor die attachment options, e.g., wire bond, solder bumps or a hybrid configuration; and (5) effective heat dissipation using an exposed pad in a QNF format package.

There is thus provided in accordance with the invention, an electronic package for millimeter wave semiconductor dies comprising a multilayer circuit board constructed from a dielectric material and having a top surface and a bottom surface, the multilayer circuit board comprising a first plurality of plated through holes adapted to convey low frequency signals between the top and bottom surfaces, at least one second plated through hole adapted to form a high frequency waveguide between the top and bottom surfaces, a semiconductor die affixed to the multilayer circuit board, a high frequency circuit board constructed from a dielectric material and affixed to the multilayer board, the high frequency circuit board comprising a waveguide transition and a printed transmission line adapted to electrically connect a high frequency port of the semiconductor to the waveguide transition.

There is also provided in accordance with the invention, an electronic package for millimeter wave semiconductor dies comprising a multilayer circuit board constructed from a dielectric material and having a top surface and a bottom surface, the multilayer circuit board comprising a cavity adapted to receive a semiconductor die, a first plurality of plated through holes adapted to convey low frequency signals between the top and bottom surfaces, at least one second plated through hole adapted to form a high frequency waveguide between the top and bottom surfaces, a semiconductor die affixed to the multilayer circuit board within the cavity, a high frequency circuit board constructed from a dielectric material, having a top surface and a bottom surface, the lower surface affixed to the multilayer board, the high frequency circuit board comprising a waveguide transition, a printed transmission line adapted to electrically connect a high frequency port of the semiconductor die to the waveguide transition and a metallic cover affixed to the top surface of the high frequency circuit board.

There is further provided in accordance with the invention, an electronic package for millimeter wave semiconductor dies comprising a multilayer circuit board constructed from a dielectric material and having a top surface and a bottom surface, the multilayer circuit board comprising a cavity adapted to receive a semiconductor die, a plurality of first plated through holes adapted to convey low frequency signals between the top and bottom surfaces, at least one second plated through hole adapted to form a high frequency waveguide between the top and bottom surfaces, a plurality of third plated through holes adapted to form a heat dissipation path between the cavity and the bottom surface of the multilayer circuit board, a semiconductor die affixed to the multilayer circuit board within the cavity, a high frequency circuit board constructed from a dielectric material, having a top surface and a bottom surface, the lower surface affixed to the multilayer board, the high frequency circuit board comprising a waveguide transition, a printed transmission line adapted to electrically connect a high frequency port of the semiconductor die to the waveguide transition and a metallic cover affixed to the top surface of the high frequency circuit board.

There is also provided in accordance with the invention, an electronic package for millimeter wave semiconductor dies comprising a multilayer circuit board constructed from a dielectric material and having a top surface and a bottom surface, the multilayer circuit board comprising a cavity adapted to receive a semiconductor die, a DC and low frequency electrical path between the top and bottom surfaces, a high frequency waveguide between the top and bottom surfaces, a heat dissipation path between the cavity and the bottom surface of the multilayer circuit board, a semiconductor die affixed to the multilayer circuit board within the cavity, a high frequency circuit board constructed from a dielectric material, having a top surface and a bottom surface, the lower surface affixed to the multilayer board, the high frequency circuit board comprising a waveguide transition, a printed transmission line adapted to electrically connect a high frequency port of the semiconductor die to the waveguide transition and a metallic cover affixed to the top surface of the high frequency circuit board.

BRIEF DESCRIPTION OF THE DRAWINGS

The invention is herein described, by way of example only, with reference to the accompanying drawings, wherein.

DETAILED DESCRIPTION OF THE INVENTION

Electronic Package Embodiment

An electronic packaging system for millimeter wave semiconductor chips provides electrical connections between a millimeter wave semiconductor chip and an electric circuit board, while providing heat dissipation and a mechanical protective environment. The configuration of the package enables the use of standard reflow solder processes for attachment to a printed circuit board.

Figure 1:
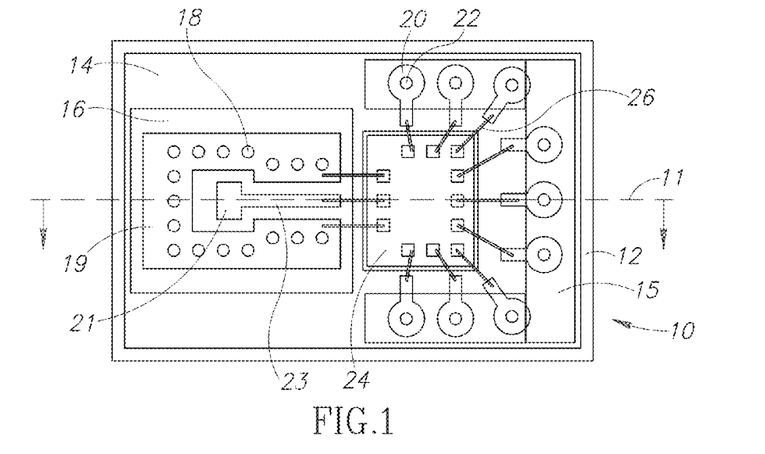
FIG. 1 is a top view of a multilayer circuit board, semiconductor chip and high frequency circuit board connected with wire bond.

A top view of a multilayer circuit board, semiconductor chip and high frequency (HF) circuit board connected with wire bonds is shown in FIG. 1. The present invention is a combination of an SMT package, a waveguide interface and low cost production and assembly into a single device which enjoys advantages of each of the above technologies while eliminating their drawbacks.

The package, generally referenced 10, comprises a multilayer circuit board 14, constructed out of any suitable material such as FR4, semiconductor die 24 mounted on the multilayer circuit board, plated through holes (PTHs) 22 within copper pads 20 tented with solder resist 15, wire bonds 26 connecting the chip to the pads, a high frequency circuit board 16, copper ground plane 19, vias 18, microstrip transmission line 23, matching element from microstrip to waveguide 21 and a bounding ring 12 for attachment of a cover (lid).

Figure 2:
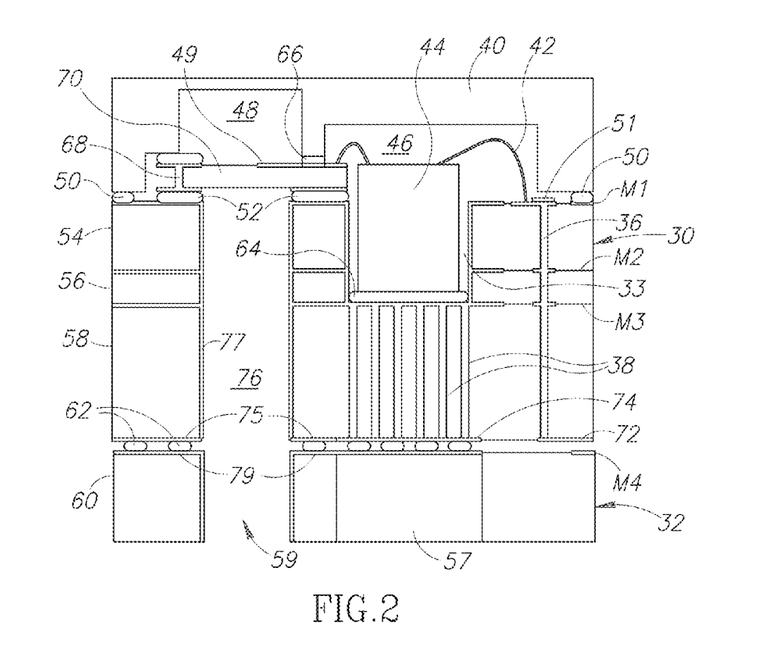
FIG. 2 is a cross sectional view of the electronic package including the cover attached on top of the multilayer circuit board and high frequency circuit board.

A cross sectional view of the electronic package including the cover attached on top of the multilayer circuit board and high frequency circuit board is shown in FIG. 2. This cross sectional view is slice 11 in FIG. 1. The package generally comprises three portions. A first portion comprises a high frequency circuit board 70 (copper clad laminate or CCL), with low dielectric loss and preferably low dielectric constant, and suitable for high frequency signal transmission. The high frequency circuit board is electrically attached to the high frequency port of the semiconductor chip 44 either by wire bond 42 or by bumps (not shown) and comprises a matching element for microstrip 49 (or stripline) to waveguide transition. In one embodiment, the high frequency circuit board is produced using standard printed circuit board (PCB) production technology, which has low cost and is suitable for high volume production. Preferably, to achieve good electrical performance, the high frequency circuit board should be made as thin as possible (e.g., 4 mil thick).

A second portion comprises a metallic cover 40 affixed to the thin high frequency circuit board using electrically conductive epoxy glue 50 thus providing the circuit board mechanical support. The metallic cover also comprises several cavities to: (1) provide space 46 for the chip (in case wire bond connections are used); (2) allow clearance 66 for delivery of signals on the high frequency circuit board; and (3) form the back-short 48 of the waveguide to microstrip transition which acts as a reflector for RF energy. If the semiconductor chip is connected to the high frequency circuit board using solder bumps (FIGS. 4 and 5), the metallic cover may be replaced by a formal FR4 laminate built as a multilayer board along with the high frequency circuit board. Similar to the high frequency circuit board, the metallic cover has very low cost and is suitable for high volume production.

A third portion comprises a multilayer circuit board 30 (e.g., FR4), having a top and bottom surface. The top surface is glued to the high frequency circuit board 70 using electrically conductive glue 52 and to the metal cover 40 by electrically conductive glue 50. The bottom surface is soldered to a PCB 32. The multilayer FR4 comprises a cavity 33 in which the semiconductor chip is placed. Thermal conductive glue 64 connects the chip to the multilayer circuit board. The multilayer circuit board comprises a plated through hole 76 that forms the waveguide and additional plated through holes for delivering signals from the chip 44 to the PCB 32 using one or more vias 36. It also forms the path for heat dissipation from the chip 44 to the heat sink 57 in the PCB, using a plurality of vias 38 extending from the bottom surface of the cavity 33 to the bottom surface of the multilayer circuit board. The multilayer circuit board is operative to combine the SMT and the waveguide interface into a single package and provides the package many of its benefits.

The multilayer circuit board 30 is fastened to the PCB 32 by solder 62 which join metal portions 72, 74, 75 on the bottom of the multilayer circuit board with metal portions on the PCB 32. The multilayer circuit board is configured such that standard SMT reflow solder processes can be used to connect the multilayer circuit board to the PCB. Using standard processes, the waveguide 76 is connected to the waveguide interface 59 on the PCB, heat dissipation channels or vias 38 are connected to the heat sink 57 and one or more low frequency signals (e.g., signals, DC, ground, etc.) are connected from the chip to the PCB.

As described supra, the package is constructed from three main portions, assembled together using an electrically conductive glue. The electrical conductive glue is required only where there is an electrical connection between the portions. In locations where there is a need for mechanical connection only (without the need for an electrical connection), it is also possible to use a non-conductive glue, which is typically less expensive. In different embodiment, the construction may use wire bond connections, bumps connections and hybrid connections (both wire bonds and bumps).

In one embodiment, the multilayer circuit board 30 is constructed of two FR4 CCL portions 54 and 58 laminated with FR4 prepreg 56 to form four metal layers M1, M2, M3 and M4. As the multilayer circuit board comprises a cavity 33 and a large plated through hole 76, the prepreg preferably has a no-flow property (sometimes referred to as low-flow), such that during the lamination phase the cavities will not be filled with the prepreg and the multilayer circuit board structure remains uniform in thickness.

In an alternative embodiment, the multilayer circuit board 30 is constructed of a single FR4 CCL, where the cavity 33 is manufactured by depth controlled milling. These two different embodiments are similar in cost and the choice between them is typically made by the PCB manufacturer according to his particular experience.

The semiconductor chip 44 is placed inside the plated cavity 33 and its bottom is attached to the M3 metal layer by a thermally conductive glue 64. Beneath the plated cavity, the M3 metal layer is connected to the M4 metal layer by thermal blind vias 38, filled with either hole filling epoxy or solder, with thick copper plating preferred, wherein the material used has a high thermal conductivity. The hole filling process serves two purposes: (1) it improves the heat dissipation from the M3 metal layer (the chip's bottom part) to the M4 metal layer which is connected/mated to the heat sink 57 on the PCB; and (2) it seals the thermal vias and thus prevents the thermal conductive glue from flowing away from the chip's cavity.

Note that in one embodiment, the thermal via may be replaced by a copper coin for high power applications. The multilayer circuit board also comprises several Plated Through Holes (PTHs) to convey low frequency signals from the top M1 metal layer to the bottom M4 metal layer where they are soldered to the PCB using standard reflow solder processes. In order to prevent solder from flowing up the PTHs, it is preferable to use narrow PTHs and plug them with solder resist 51 on the M1 metal layer. The solder resist can be replaced either by solder or by epoxy hole filling or by any other method for via plugging. In FIG. 2, the connection between the semiconductor chip and the pads on the M1 layer is achieved using wire bonds.

The high frequency signal (i.e. mmWave signal) is transmitted in the multilayer circuit board by the plated through hole 76 which serves as a waveguide. Examples of mmWave signals include E-Band signals having frequencies anywhere in the range of 60-90 GHz. The connection between the waveguide 76 and the semiconductor chip 44 is achieved through the high frequency circuit board 70. The waveguide is drilled out or otherwise formed to have the desired shape and dimensions which is typically different for signals of different frequencies. For example, the hole is drilled out or fashioned using other shaping tools to have, for example, a round, elliptical, square or rectangular shape. Due to the difficulty of forming squared corners, the shape may have rounded corners compatible with the particular manufacturing process used.

The high frequency circuit board is attached to the M1 (i.e. top) metal layer of the multilayer circuit board by electrically conductive epoxy glue 52. It is preferable to use a high viscosity electrical conductive glue in order to accurately define the glue's spread without bleed-out or the flow of glue into the waveguide, the chip's cavity or any of the pads on the M1 metal layer that should not be shorted to ground. The dispensing of the glue is preferably done using an automated glue dispenser. In addition, placement of the high frequency circuit board is preferably done using an automated pick and place machine to achieve the highest position accuracy as possible and to enable a high volume, low cost repetitive production.

As part of the assembly of the package, the chip is attached to the high frequency circuit board and to the multilayer circuit board by wire bonds (as shown in FIG. 2). The chip's cavity depth is preferably such that the pads on the surface of the chip and the copper on the top surface of the high frequency circuit board are substantially the same height. This allows for minimum length wire bonds for the high frequency signal.

The high frequency signal propagates on the high frequency circuit board in a printed transmission line 49 such as a microstrip or a stripline until it reaches a matching element which transmits the signal from the high frequency circuit board to the waveguide 76. There are several well-known methods for matching a waveguide to a microstrip that can be implemented in this structure. These methods can include, for example, matching elements on the printed high frequency circuit board or as part of the back-short 48 or a combination of the two.

In order to achieve low insertion loss in the transition from the semiconductor chip to the high frequency circuit board, a matching element is used to compensate for the inductive nature of the wire bond and for the capacitive nature of the pads on the semiconductor chip and on the high frequency circuit board. The signal should be sent in a ground-signal-ground configuration to reduce as much as possible the radiation loss.

Figure 3:
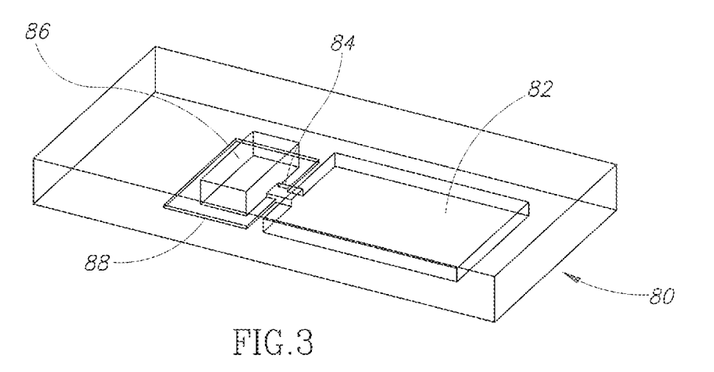
FIG. 3 is a three dimensional perspective view of the cover showing the cavities within.

The final part of the package comprises the cover (lid) to provide mechanical protection to the semiconductor chip and wire bonds. A three dimensional perspective view of the cover showing the cavities within is shown in FIG. 3. In one embodiment, the cover 80 is constructed from a metal or from an insulating material (such as FR4 or plastic) plated with metal. In the example embodiment shown, the cover has four cavities, namely, (1) a cavity 82 for the chip and wire bonds (corresponding to cavity 42, FIG. 2), (2) an electromagnetic cage (cavity) 84 above the transmission line (e.g., microstrip) that creates a boundary to prevent radiation losses (corresponding to microstrip bounding 66, FIG. 2), (3) a cavity 86 for the back-short over the waveguide to microstrip transition (corresponding to cavity 48, FIG. 2), above a cavity 88 that houses the high frequency circuit board and (4) a cavity 88 for the high frequency circuit board.

The cover is attached to a bounding ring 12 (FIG. 1) on the multilayer circuit board (by either an electrically conductive glue or by non-conductive glue) and to the copper ground plane on the high frequency circuit board by an electrically conductive glue. The glue preferably has high viscosity to prevent it from flowing outside its intended locus. Note that the cavities in the lid are indicated by hatching in FIG. 2 (and FIG. 5). The microstrip bounding cavity is marked by narrow hatching while the back-short cavity and the chip and wire bond cavity are marked with wider hatching.

In one embodiment, the cover comprises two portions where, due to inaccuracies in assembly and production, there may difficulties assembling the cover on the package such that the cover accurately mates with the high frequency circuit board and the multilayer circuit board. In this embodiment, the first cover portion is placed on top of the high frequency circuit board to serve as a back-short and a microstrip bounding while a second cover portion is placed on the bounding ring of the multilayer circuit board (and also over the first cover) to provide mechanical protection to the entire package. The first lid may be replaced by a multilayer circuit board, laminated to the high frequency circuit board, with similar shape and dimensions as the metallic cover. The package attachment to the electrical circuit board is achieved by reflow soldering to the M4 metal layer of the multilayer circuit board. Since both the waveguide interface and the low frequency pads are located on the same plane, all connections are made at the same time during the soldering process without the need for additional physical connections.

The M4 metal layer comprises several areas as described below. A first area comprises low frequency (e.g., signals, DC, ground, etc.) pads 72 that are electrically connected to the plated through hole (PTH) 36 and, by means of wire bond 42, to the semiconductor chip. The soldering of these pads is performed to appropriate pads on the PCB.

A second area comprises an exposed pad 74 for heat dissipation. This pad is thermally connected to the bottom of the semiconductor chip 44 through the blind via 38 from the M3 metal layer to the M4 metal layer. The soldering of the exposed pad 74 is performed to the heat sink 57 located on the PCB 32.

A third area comprises connection of the waveguide interface 76. This pad 75 is electrically connected to the waveguide walls 77. The connection is made by soldering the 75 pad to a mating pad 79 on the PCB.

Thus, several connections are made between the multilayer circuit board and the PCB to which it is mounted on. The connections include (1) DC, ground and other low frequency signal connections; (2) a waveguide connection; and (3) a heat transfer connection to the heat sink on the PCB. The connections are made using standard wave/reflow soldering and minimizes the number parts required, PCB real estate required and the number of connections required.

Figure 4:
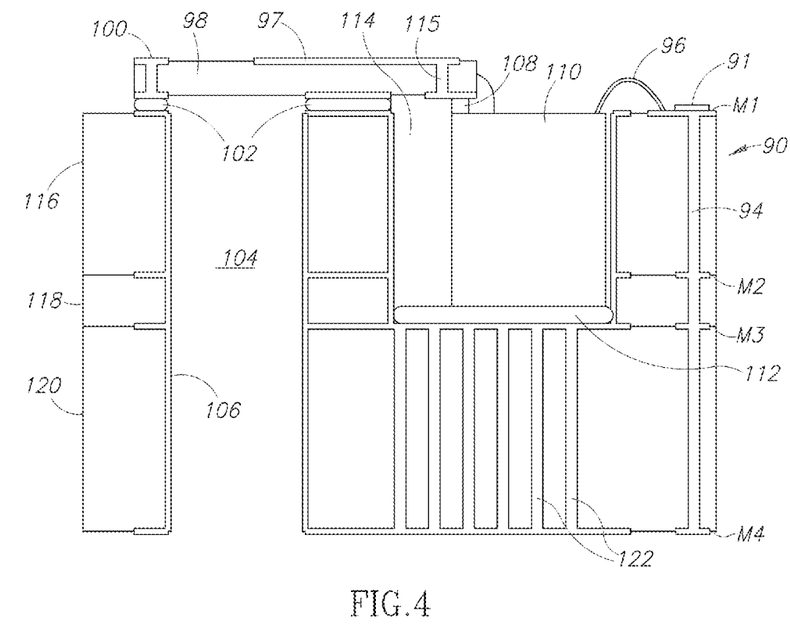
FIG. 4 is a cross sectional view of a hybrid electronic package including bumps and wire bond between the multilayer circuit board, high frequency circuit board and semiconductor chip.

In an alternative embodiment, the package comprises hybrid connections to the chip. A cross sectional view of a hybrid electronic package including bumps and wire bond between the multilayer circuit board, high frequency circuit board and semiconductor chip is shown in FIG. 4. The hybrid connection package is similar to the wire bond connection package (FIG. 2), except for the method of connecting the high frequency circuit board to the semiconductor chip. The multilayer circuit board 90 is similar to that of the wire bond embodiment except the chip's cavity depth is preferably similar to the thickness of the chip so that a bump 108 placed on the chip's high frequency pad projects above the M1 metal layer plane, as shown in FIG. 4.

In the hybrid embodiment, the low frequency signals are connected using the same method as in the wire bond configuration of FIG. 2, i.e. via PTHs 94 with solder resist 91 on the upper surface. After the chip 110 is placed in the cavity of the multilayer circuit board 90 and affixed using thermal conductive glue 112, the high frequency circuit board 98 is assembled by soldering it to the bumps 108 on the chip and joining them by underfill (UF) 114. The low frequency signals are connected from the chip 110 to the PTHs 95 using bond wire connections 96. The high frequency signal is transmitted from the bottom surface of the high frequency circuit board to the top surface through via 115 so that it will not short to the multilayer circuit board top metal, as the cavity is wider than the chip which is affixed to the multiplayer circuit board using thermal conductive glue. From the via 115, the high frequency signal travels along the transmission line 97 (23, 21 in FIG. 1). A plurality of vias 100 connect the ground from the high frequency circuit board to the multilayer circuit board. These vias 100 are indicated in FIG. 1 as dots 18. After the UF cures, the high frequency circuit board is attached to the M1 metal layer using electrically conductive glue 102 or solder to form the electrical connection to the waveguide interface 104.

The remainder of the hybrid configuration package is similar to that of the wire bond configuration package, including the transition to the waveguide 104, assembly of the cover (not shown) and mounting technique onto the PCB. In an alternative embodiment, the assembly is simplified using gold stud bumps. Note that the gold stud bumps can be placed on the semiconductor chip using the same standard ball-bonder machine that makes the wire bonds. As in the wire bond embodiment, the hybrid package also comprises an FR4 layer 116, 120 and prepreg layer 118 and heat sink dissipation blind vias 122.

Figure 5:
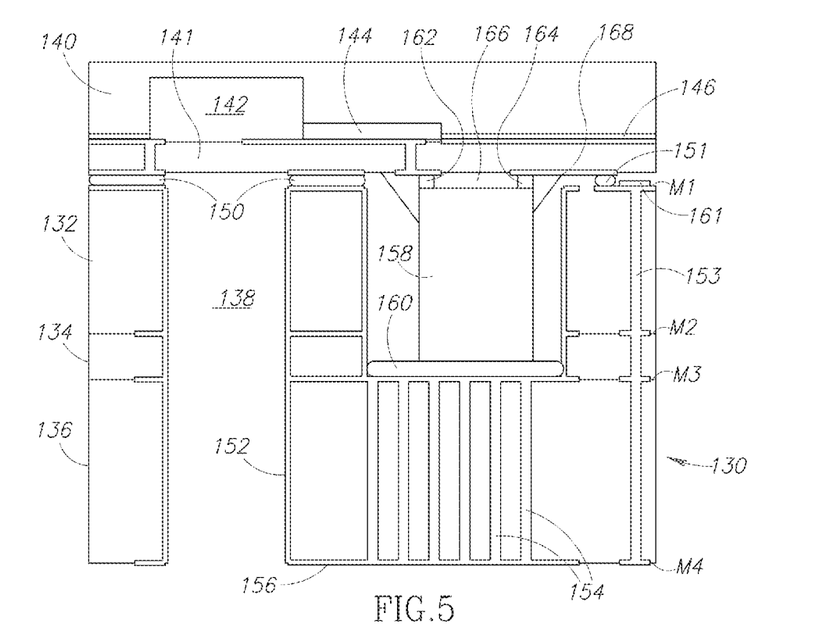
FIG. 5 is a cross sectional view of an electronic package including bumps between the high frequency circuit board and semiconductor chip.

In an alternative embodiment, the electronic package is constructed with bumps for electrical connections. A cross sectional view of an electronic package including bumps between the high frequency circuit board and semiconductor chip is shown in FIG. 5. In this bump connection embodiment, all the pads of the chip are electrically attached to the bottom face of the high frequency circuit board 141 by bumps 162, 164 and underfill (UF) 166. Since the high frequency circuit board 141 is preferably thin in order to achieve good electrical performance, it may have high warpage during the soldering process, potentially causing a failure. In this case, a mechanical support can be provided to the high frequency circuit board by attaching it to a plate or laminating it to a thick multilayer circuit board.

The main difference between the bump configuration embodiment (FIG. 5) and the hybrid configuration embodiment (FIG. 4) is in the method of delivering the low frequency signals and the method of connecting the high frequency circuit board to the multilayer circuit board 130. While the high frequency signal is delivered (via bumps 162) using the same method, the low frequency signals (DC, ground, signals) travel (via bumps 164) on the bottom face of the high frequency circuit board 141 until they reach larger pads on the outer periphery. The multilayer circuit board comprises FR4 layers 132, 136 and prepreg layer 134 and corresponding pads that are connected to the high frequency circuit board through small electrically conductive glue dots 151. These pads also comprise the M1 to M4 plated through holes 153 and thus making the low frequency connection from the chip to the PCB complete.

Since the chip 158 is joined to the high frequency circuit board via bumps 162, 164, it cannot be glued to the multilayer circuit board, thus the thermal connection to the M3 metal layer is achieved with a viscose thermal interface material 160.

The metal (or metallized) cover 140 is glued to the top face of the high frequency circuit board 141 using an electrically conductive glue 146. As shown in FIG. 5, since some low frequency traces move above a ground plane in the multilayer circuit board there is a risk of shorting the low frequency signals to ground since the high frequency circuit board and the multilayer circuit board are glued together. To overcome this risk, a solder resist 161 is applied on both the high frequency circuit board and on the multilayer circuit board leaving openings only for the attachment of the chip and the conductive glue locus 150, 151 and the high frequency signal on the bottom face of the high frequency circuit board.

Figure 6:
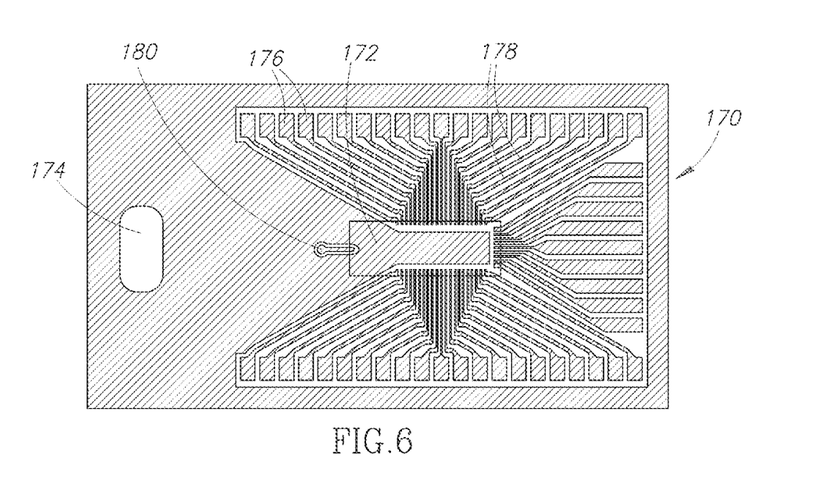
FIG. 6 is a diagram of the bottom face of the high frequency circuit board using the bump configuration.

A diagram of the bottom face of the high frequency circuit board using the bump configuration is shown in FIG. 6. The copper traces on the bottom face of the high frequency circuit board 170 are indicated by the shading. The copper traces include signal traces 178, conductive glue dots pads 176, chip position 172, short trace and via 180 for the high frequency signal transmission line, and an opening for a waveguide interface 174. The intended location of the chip is marked with hatching. The high frequency signal trace 180 begins at the chip and ends with a via that delivers the signal to the top face of the high frequency circuit board. Note that each pad 176 is centered over a PTH 153 (FIG. 5) through the multilayer circuit board to the PCB.

Chip to Circuit Board Transition Embodiment

Figure 7:
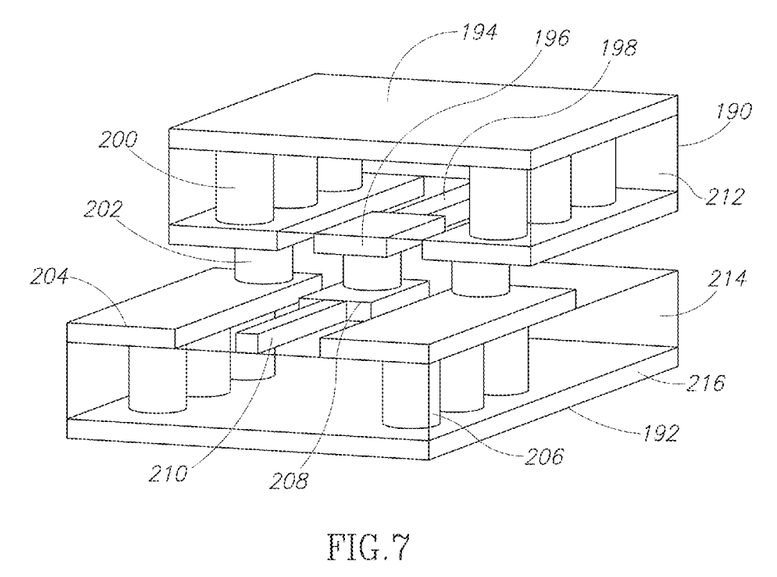
FIG. 7 is a diagram illustrating a semiconductor chip to high frequency circuit board transition utilizing bumps.

In another embodiment, the high frequency transition is improved by providing an improved impedance match between a semiconductor chip and the high frequency circuit board (i.e. CCL). A diagram illustrating a semiconductor chip to high frequency circuit board transition utilizing bumps is shown in FIG. 7. For better clarity, the transition is shown with a portion of the semiconductor chip cut away. The high frequency circuit board 192 is constructed from dielectric material 214, and comprises a ground plane 216, vias 206, high frequency transmission line 210, high frequency pad 208 and high frequency ground 204. The semiconductor chip 190 comprises semiconductor material 212, ground plane 194, chip vias 200, high frequency signal trace 198 and high frequency pad 196.

The semiconductor chip to high frequency circuit board wide band transition is achieved using bumps 202 and has extremely wide bandwidth and very low real estate consumption, both on the chip and the high frequency circuit board. Note that this transition may be used in the hybrid configuration embodiment, as well as in the bump configuration embodiment since the high frequency design is the same in those configuration embodiments. The transition is optimized to resonate the inductive and capacitive nature of the bumps and pads of the transition.

The transition of the present invention is intended to be used with semiconductor chips comprising several conductive layers wherein one of these layers carries the high frequency signal and other layer(s) carry the ground currents. This allows for the realization of a transmission line (e.g., microstrip transmission line) and optimization of the ground plane.

Figure 8:
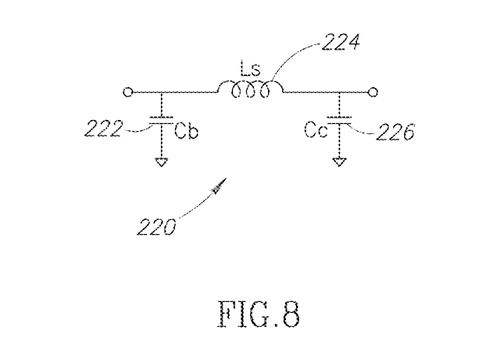
FIG. 8 is a circuit diagram illustrating an electrical model of the semiconductor chip to high frequency circuit board transition.

First, a model of the chip to high frequency circuit board transition where the transition is non-matched and uses bumps (as shown in FIG. 7) is presented. A circuit diagram illustrating an electrical model of the semiconductor chip to high frequency circuit board transition is shown in FIG. 8. The appropriate model, generally referenced 220, for this transition comprises a series inductor (Ls) 224 which represents the bump 202, and shunt capacitors (Cc) 226 and (Cb) 222 to represent the capacitance of the pads. The capacitance from the pad 196 to the semiconductor chip is denoted by (Cc) 226 and the capacitance from the pad 208 to the board is denoted (Cb) 222. In addition, there is also a shunt capacitance between the high frequency signal bump 202 and the high frequency ground bumps, which is also included in this model.

Figure 11:
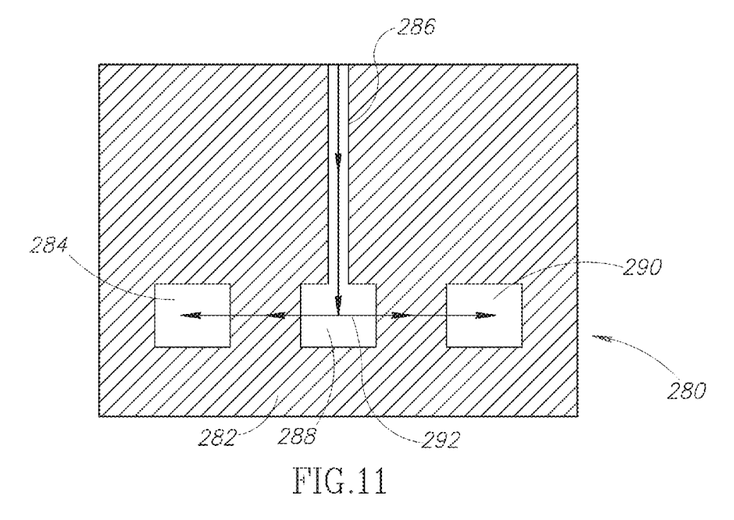
FIG. 11 is a diagram illustrating a semiconductor chip with a microstrip and three pads in a ground-signal-ground fashion.

To achieve an optimal wide-band transition (i.e. no reflections), the impedance of the transition should match that of the transmission line (usually set to 50Ω), such that its shunt capacitance and its series inductance is minimized as much as possible. The shunt capacitance Cc is set by the bump pad inside the chip, which is usually much wider than the microstrip line inside the chip, with respect to the ground plane inside the chip. The shunt capacitance Cb is set by the pad on the PCB with respect to the ground plane on the PCB. As the pads on the chip and on the PCB have similar size, and the PCB thickness is much greater than the distance between the pad inside the chip and the ground plane inside the chip, the usual case is Cc>>Cb, hence the focus on reducing Cc. The series inductance is set by the difference in current paths lengths of the signal current and the ground current inside the chip. As the signal current flows on the microstrip to the signal pad inside the chip and from there to the signal bump, the ground current follows an identical path on the ground plane and only above the signal pad turns for the ground pads. Hence, the ground current 292 has a longer path than the signal current, as can be seen in FIG. 11 where the portion of the chip, generally referenced 280, comprises a ground plane 282, microstrip 286, high frequency signal pad 288, and ground pads 288, 290. Note that the ground currents are indicated as arrows.

Figure 12:
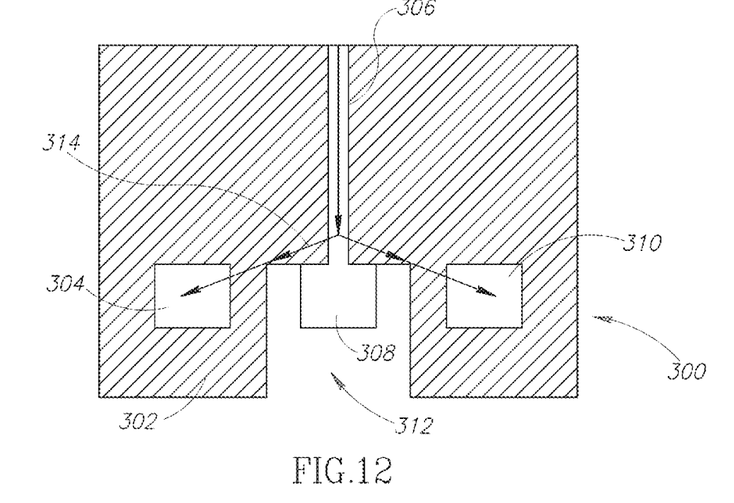
FIG. 12 is a diagram illustrating a semiconductor chip with a microstrip, three pads in a ground-signal-ground fashion and a metal ground reduction.

The present invention provides a mechanism to match the semiconductor chip to a high frequency circuit board transition by altering the ground plane inside the chip. In an example embodiment, a portion of the ground plane above the high frequency pad inside the chip is eliminated. In this way, the shunt capacitance is reduced since the distance between the ground plane and the high frequency signal pad increases, while at the same time the series inductance decreases since the ground current can no longer follow the bump signal current and hence will make a shorter path as shown in FIG. 12 where the portion of the chip, generally referenced 300, comprises a ground plane 302, microstrip 306, high frequency signal pad 308, and ground pads 304, 310. Thus, removing a portion of the ground plane substantially cancels the original impedance mismatch of the transition between the chip and the circuit board.

Figure 9:
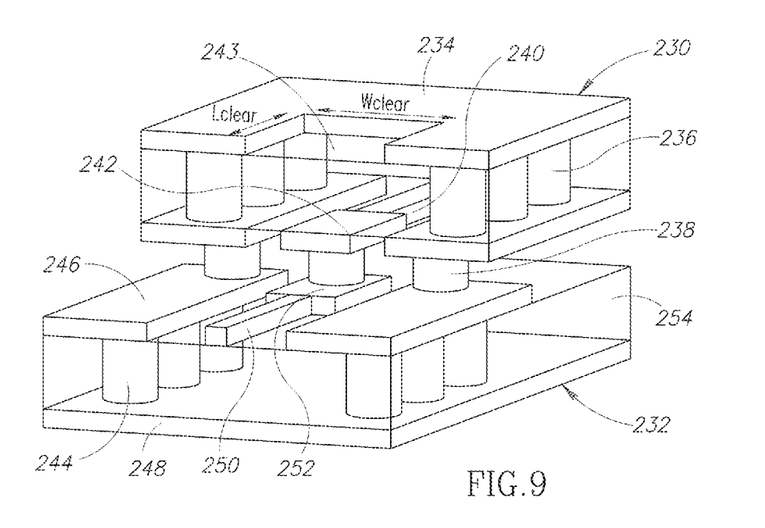
FIG. 9 is a diagram illustrating a semiconductor chip to high frequency circuit board transition utilizing bumps with a portion of the ground plane removed.

A diagram illustrating a semiconductor chip to high frequency circuit board transition utilizing bumps with a portion of the ground plane removed is shown in FIG. 9. For better clarity, the transition is shown with a portion of the semiconductor chip cut away as in FIG. 7. The high frequency circuit board 232 is constructed from dielectric material 254, and comprises a ground plane 248, vias 244, high frequency transmission line 250, high frequency pad 252 and high frequency ground 246. The semiconductor chip 230 comprises semiconductor material 236, ground plane 234, chip vias 236, high frequency signal trace 240 and high frequency pad 242. Bumps 238 connect the high frequency pads 242 and 252. The bumps may comprise any suitable material such as copper pillars (sometimes referred to as C2), solder balls, C4, gold balls, etc.

The diagram of FIG. 9 illustrates an example embodiment of the matching mechanism, using a rectangular ground clearance 243 having length Lclear and width Wclear. In this example, the geometry of the missing ground is rectangular with length Lclear and width Wclear. In alternative embodiments, the ground plane clearance may comprise other shapes such as a triangle, trapezoid, circle, square, etc. The exact shape and size of the removed ground clearance may be optimized utilizing well-known 3D full-wave electromagnetic numerical solution techniques and available software.

In one embodiment, the values for the dimensions Lclear and Wclear are set such that the ground reduction will at least overlap the entire signal pad so the shunt capacitance Cc is minimized. The wider the pitch between the pads, the difference between the ground current path and the signal current path is larger, and therefore the ground clearance should also increase.

Minimizing Radiation Loss Embodiment

Figure 10:
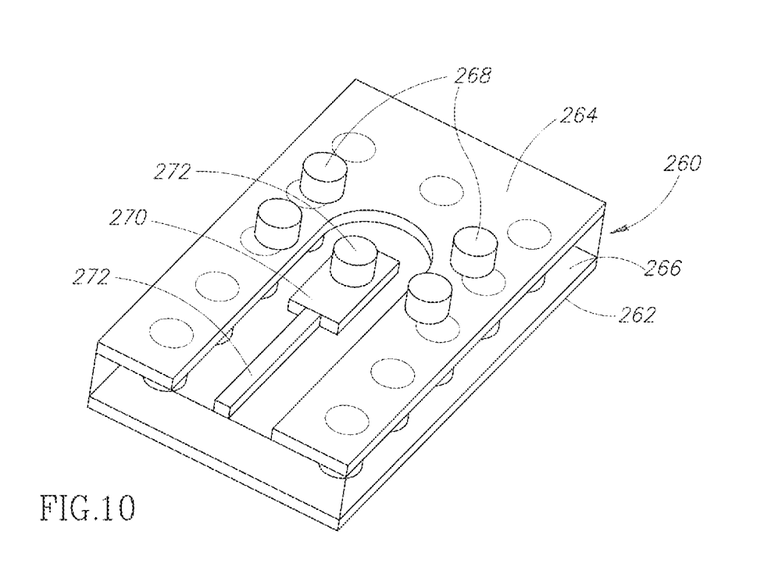
FIG. 10 is a diagram illustrating a semiconductor chip to high frequency circuit board transition utilizing bumps with an additional ground plane portion encircling a high frequency signal bump.

In another embodiment of the present invention, a mechanism is provided to minimize the radiation losses through the high frequency transition. A diagram illustrating a semiconductor chip to high frequency circuit board transition utilizing bumps with an additional ground plane portion encircling a high frequency signal bump is shown in FIG. 10. The circuit board, generally referenced 260, comprises dielectric material 266, ground plane 262, ground area 264, high frequency transmission line 272, high frequency pad 270, high frequency signal bump 272 and additional bumps 268.

The radiation/RF confinement mechanism is another aspect of the high frequency transition of the invention. The mechanism is operative to confine the electromagnetic fields to the region of the bumps thereby reducing radiation/signal loss. In an example embodiment, the confinement of the radiation is achieved by adding an additional ground plane 264 on the high frequency circuit board 260 that encloses the high frequency signal bump 272. Thus, the chip to high frequency circuit board transition comprises an extra ground plane that encircles the high frequency signal bump 272. Note that in FIG. 10 the chip does not appear for illustration purposes but is normally present.

Since the additional ground plane is preferably located beneath the chip, it does not increase the total size of the transition. Moreover, the transition including the extra ground plane does not force any change in the design of the semiconductor chip. In the example shown in FIG. 10, the transition comprises two additional bumps. It is noted that the additional bumps do not improve the electrical performance of the transition and that the transition may be well defined with or without them. In one application, the bumps are used in cases where chip does not have sufficient bumps to form a mechanically stable connection.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An electronic package for semiconductor dies, comprising:
    a multilayer circuit board constructed from a dielectric material and having at least two layers surrounding a cavity, a top surface and a bottom surface;
    a high frequency circuit board having a bottom face and constructed from a dielectric material and affixed to said multilayer board by electrically conductive glue, wherein the high frequency circuit board comprises a ground plane;
    at least one plated through hole connecting the at least two layers, for electronic signal connection; and
    a semiconductor die comprising at least one pad for high frequency signal, at least one pad for high frequency ground and a multiplicity of pads for direct current (DC) or control,
    wherein a top face of said semiconductor die is electrically attached to a bottom face of said high frequency circuit board by at least two conductive bumps, such that each conductive bump is attached to one pad, and
    wherein a bottom face of said semiconductor die is thermally connected to at least one of the at least two layers by thermal interface material.

2. The electronic package according to claim 1, wherein said multilayer circuit board further comprises heat sink dissipation means from said semiconductor die to said bottom surface of said multilayer board.

3. The electronic package according to claim 2, wherein said heat sink dissipation means is at least one blind via.

4. The electronic package according to claim 1, further comprising a cover affixed over and encasing said multilayer board, said semiconductor die and said high frequency circuit board.

5. The electronic package according to claim 1, wherein said multilayer circuit board comprises FR4 material.

6. The electronic package according to claim 1, wherein said cavity is a waveguide and wherein said waveguide is substantially rectangular in shape.

7. The electronic package according to claim 1, wherein assembling of said electronic package is performed using standard reflow solder processes.

8. The electronic package according to claim 1, wherein said electronic package comprises a quad no-lead flat form factor and adapted to enable transmission of low frequency and DC signals from said semiconductor die to said bottom surface of said multilayer circuit board.

9. The electronic package according to claim 1 wherein said cavity is a waveguide.

10. The electronic package according to claim 1 wherein said multilayer circuit board further comprises at least one prepreg layer.

11. The electronic package according to claim 1 wherein said semiconductor die is mechanically attached to said high frequency circuit board also by underfill.

12. The electronic package according to claim 1, wherein the at least two layers surround a multiplicity of cavities.

13. The electronic package according to claim 1, wherein the semiconductor die further comprises a ground plane.

14. A method for creating an electronic package for semiconductor dies, comprising:
    electrically attaching a top face of a semiconductor die comprising at least one pad for high frequency signal, at least one pad for high frequency ground and a multiplicity of pads for direct current (DC) or control, to a bottom face of a high frequency circuit board by at least two conductive bumps, such that each conductive bump is attached to one pad, thereby providing electric contact to the semiconductor die, wherein the high frequency circuit board comprises a ground plane;
    thermally attaching by thermal interface material a bottom face of the semiconductor die to at least one of at least two layers of a multilayer circuit board constructed from a dielectric material, thereby providing thermal contact to the semiconductor die; and
    electrically attaching the high frequency circuit board to the multilayer circuit board, thereby providing electrical contact between the semiconductor die and the multilayer board, for connecting the DC or control pads to the bottom of the package and for connecting the at least one high frequency signal pad to a waveguide at a single assembly process.

15. The method according to claim 14, wherein the semiconductor die further comprises a ground plane.

* * * * *